United States Patent [19]

Purves

[11] Patent Number: 4,553,092
[45] Date of Patent: Nov. 12, 1985

[54] APPARATUS AND METHOD FOR TEMPERATURE ESTIMATION OF OVERHEAD CONDUCTORS

[75] Inventor: Robert B. Purves, Kent, Wash.

[73] Assignee: The Boeing Company, Seattle, Wash.

[21] Appl. No.: 451,433

[22] Filed: Dec. 20, 1982

[51] Int. Cl.$^4$ ............................................. G01R 5/22
[52] U.S. Cl. .................................. 324/106; 340/664; 361/103
[58] Field of Search ................ 324/106; 340/664, 635; 364/483, 802, 806; 307/39; 361/24, 62, 103, 107

[56] References Cited

U.S. PATENT DOCUMENTS

| | | |
|---|---|---|
| 706,177 | 8/1902 | Heaphy . |
| 3,128,371 | 4/1964 | Spaulding et al. . |
| 3,425,049 | 1/1969 | Robinson . |
| 3,500,184 | 3/1970 | Ho . |
| 3,622,849 | 11/1971 | Kelley, Jr. et al. ................ 361/103 |
| 3,671,860 | 6/1972 | Kettler et al. ..................... 324/106 |
| 4,001,649 | 1/1977 | Young ................................ 361/103 |
| 4,216,421 | 8/1980 | Dupont . |
| 4,432,031 | 2/1984 | Premerlani ........................ 364/483 |

FOREIGN PATENT DOCUMENTS

| | | |
|---|---|---|
| 0010762 | 5/1980 | European Pat. Off. . |
| 2548514 | 5/1976 | Fed. Rep. of Germany . |
| 432541 | 12/1972 | U.S.S.R. . |

OTHER PUBLICATIONS

A New Thermal Rating Approach: The Real Time Thermal Rating System for Strategic Overhead Conductor Transmission Lines (Part 1 and Part 2), Davis.

Primary Examiner—Stewart J. Levy
Assistant Examiner—Stephen M. Baker
Attorney, Agent, or Firm—Finnegan, Henderson, Farabow, Garrett & Dunner

[57] ABSTRACT

An overhead conductor monitoring device includes a simulation conductor designed to have thermal characteristics similar to those of the overhead conductor. The simulation conductor is placed in the same ambient atmosphere as the overhead conductor and is selectively heated by a coil embedded within the simulation conductor. The power supply to the coil is computed by a microcomputer to be the same as the power of the overhead conductor. Temperature sensors are placed in or on the simulation conductor to monitor the temperature thereof. As the temperature of the simulation conductor increases, the power of the overhead conductor is recomputed to reflect changes in the characteristics of the overhead conductor. An alarm signal is generated if the temperature of the simulation conductor exceeds a predetermined temperature and theoretical values of overhead conductor power can be supplied microprocessor to determine the effects on the temperature of the overhead conductor.

12 Claims, 3 Drawing Figures

APPARATUS AND METHOD FOR TEMPERATURE ESTIMATION OF OVERHEAD CONDUCTORS

FIELD OF THE INVENTION

This invention relates with particularity to a device for monitoring an overhead conductor having current flowing therethrough and a method for preventing thermal damage to the monitored overhead conductor and for maintaining required ground clearances.

BACKGROUND OF THE INVENTION

The loading of overhead conductors depends upon several physical properties including the power applied to the conductor and the ambient conditions of the conductor. Electric utilities must be careful that overhead conductors not be overloaded and service interrupted.

It is a common practice for electric utilities to rate an overhead conductor by calculating the loading of the conductor as a result of certain worst case conditions. For example, the upper limits of conductor loading may be based upon a specified limiting temperature under worst case weather conditions and an expected load. When the line loading exceeds its rating, the utility is obligated to either reduce the line loading, maintain loading and reduce the service life of the line, or assume that the required ground clearances will be violated.

Oftentimes, utilities will conduct surveys and long term planning projects in an attempt to estimate expected load requirements. If, based upon the ratings of the available overhead conductors, it is determined that the rating of existing conductors will be exceeded under worst case conditions, then the utility may undertake the great expense of providing additional overhead conductors. Although this additional capital investment may often be justified in the long term, it may be possible to avoid or to postpone the expense if more accurate information were available concerning overhead conductor loading.

A factor extremely important to the loading of an overhead conductor is the temperature of the conductor. The temperature of the conductor is due in part to its internal resistance. In addition, the temperature of an overhead conductor is affected by ambient weather conditions, e.g., temperature and wind velocity. It is probable that even when the rating of an overhead conductor is exceeded, the actual temperature of a conductor will be below the harmful limit used to establish the rating. This is because it is relatively unlikely that worst case weather and line overload occur at the same time. The real line rating may in fact not have been exceeded. Thus, if the temperature of the overhead conductor could be monitored in a real time manner, there would be no need to initiate an overload alarm based on rating estimates. Instead, the actual temperature limit could be used as the operative variable.

Ideally, the utility operators would have some advance notice that the conductor temperature is approaching its limit along with some additional information such as an estimate of the time remaining before the occurrence of a critical overload. The ability to monitor the conductor temperature with reference to a temperature limit would, of course, mean that the probability of exceeding the conductor rating would be reduced.

There are numerous existing and proposed methods for measuring the temperature of an overhead conductor. One procedure is to attach a thermocouple to the overhead conductor and to supply the output of the thermocouple to a transmitter. Such a device is placed directly on the high voltage conductor and as a result is inconvenient to install and service. Moreover, the thermocouple is capable of only measuring surface temperature with the accuracy of measurement depending upon the quality of the thermal contact between the thermocouple and the surface of the conductor. Also, a single localized measurement may not be representative of the whole conductor. (Temperature variations of 10 to 15 degrees have been observed for different thermocouples on the same physical conductor span.)

An infrared pyrometer has been proposed as an additional means for monitoring the temperature of overhead conductors. Such a device measures the radiation temperature, based upon spectral peak, of the conductor, and requires a transmitter for information dissemination. There are some inherent inaccuracies in the use of infrared pyrometers because of the underlying assumptions made about the color of the conductor radiation. Also, several calibrations may be required during the life of the conductor because of changes in surface color resulting from weathering.

Another proposed method for conductor monitoring is a calculation procedure for temperature estimation. This procedure utilizes ambient weather and line loading to estimate conductor temperature. Again, this procedure merely deals with an estimate and has several drawbacks. One of these drawbacks is that weather variables must be measured locally. Typical measurements would include wind speed, wind direction, air temperature, solar radiation, and atmospheric turbulence. Such measurements are often not accurate or are incomplete. For example, typical anemometers measure only the horizontal component of wind speed even though the vertical wind speed component is significant in cooling. Moreover, the wind speed should be measured on a scale related to the diameter of the conductor which complicates measurement. Finally, temperature calculations involve the solutions of largely empirical equations based upon major assumptions and are subject to large error ranges.

Thus, it is clear that prior attempts to prevent the overheating of overhead conductors have met with only a moderate degree of success. The benefits of an accurate and inexpensive device for overhead conductor monitoring have yet to be attained.

SUMMARY OF THE INVENTION

It is accordingly an object of the present invention to monitor the temperature of an overhead conductor in an accurate manner.

A further object of this invention is to warn of the overloading of an overhead conductor by simulating the temperature of the conductor in a real time manner.

Another object of this invention is to determine the effects of a theoretical load on an overhead conductor.

It is yet another object of this invention to maximize the utilization of existing overhead conductors.

A further object of this invention is to determine in a real time manner the effects of changes in actual ambient conditions of an overhead conductor on the loading of the conductor.

To achieve the foregoing objects in accordance with the invention, as embodied and broadly described herein, a device for monitoring an overhead conductor having current flowing therethrough comprises a simulation conductor positioned in the same ambient conditions as the overhead conductor to be monitored, means for heating the simulation conductor, means for selectively supplying power to the heating means to generate heat in the simulation conductor equal to the heat being dissipated in the overhead conductor, means for sensing the actual temperature of the simulation conductor, and means for indicating if the temperature of the simulation conductor exceeds a predetermined temperature.

The foregoing objects are further attained by a method for preventing thermal damage to an overhead conductor having current flowing therethrough comprising the steps of providing a simulation conductor in the same ambient conditions as the overhead conductor, providing means for heating the simulation conductor, selectively supplying power to the heating means such that the simulation conductor dissipates the same amount of heat per linear unit as the amount of heat dissipated by the overhead conductor per linear unit, sensing the actual temperature of the simulation conductor, and generating an alarm signal if the actual temperature of the simulation conductor exceeds a predetermined temperature.

BRIEF DESCRIPTION OF THE DRAWINGS

The manner in which the apparatus of the present invention is constructed and the method of the present invention practiced can best be understood in light of the following detailed description, together with the accompanying drawings, in which.

DETAILED DESCRIPTION OF THE PREFERRED EMBODIMENT

Figure 1:
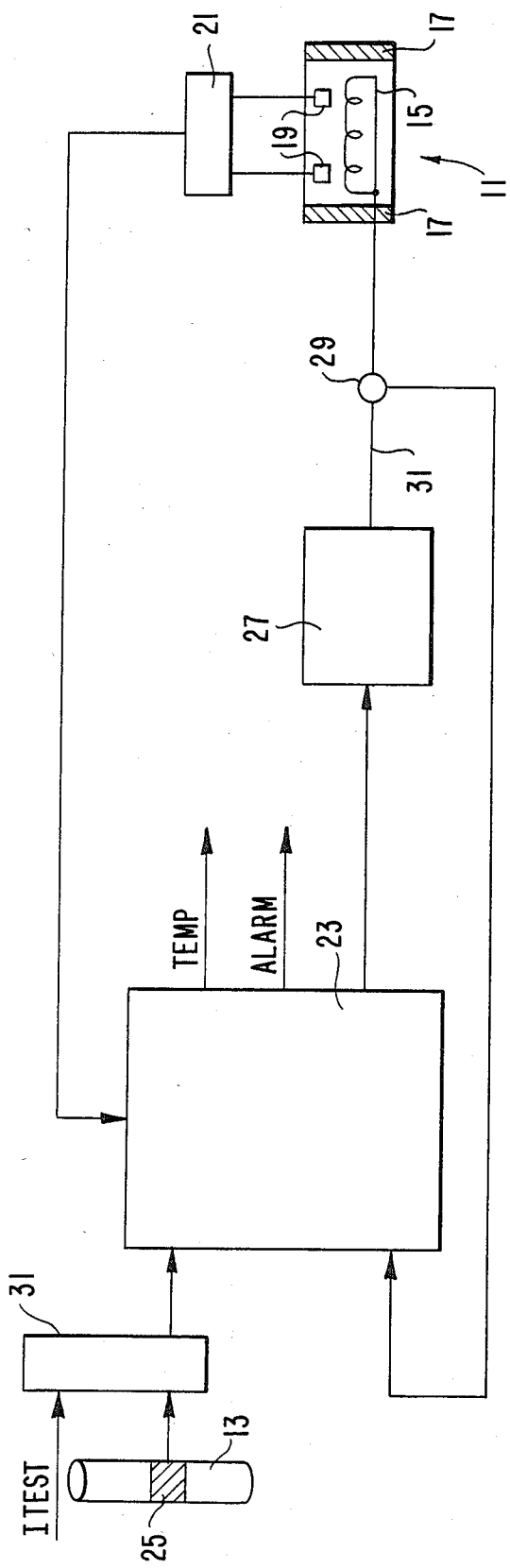
FIG. 1 is a schematic illustration of the device for monitoring an overhead conductor to enable the practicing of a method for preventing thermal damage to the overhead conductor as a result of overload.

FIG. 1 illustrates a preferred embodiment of the instant invention. The device for monitoring an overhead conductor having current flowing therethrough comprises a simulation conductor 11 positioned in the same ambient conditions as an overhead conductor 13 to be monitored. Means for heating the simulation conductor is provided. As embodied herein, the heating means comprises a coil 15 located within the simulation conductor 11.

It is contemplated that the simulation conductor 11 would be monitored near the overhead conductor, for example on a utility pole or tower near a substation. The electronics and microcomputer used in conjunction with the simulation conductor, as described below, can be provided at the substation or at a central facility with appropriate data and control signals being telemetered between the central facility and the simulation conductor 11.

In the preferred embodiment, the length of the simulation conductor 11 is at least ten times larger than the diameter of the simulation conductor. The simulation conductor 11 has surface dimensions, thermal capacity, color, and texture identical to the overhead conductor 13. Also, an insulation terminal 17 can be provided at each end of the simulation conductor 11 to insulate the ends of the simulation conductor 11 in a manner which simulates the thermal effects of the length of an actual overhead conductor.

As stated above, the simulation conductor 11 is heated in a controlled manner by the heating coil 15. One or more temperature sensors 19, such as a two terminal IC temperature transducers marketed by Analog Devices, Inc. as model AD590, are spaced along the simulation conductor 11. To overcome the problems of thermal contact the temperature sensors 19 may be bonded to the simulation conductor 11.

The installation of bonded temperature sensors in connection with an actual overhead conductor would be difficult and perhaps impossible because of the high tension and voltage of such conductors.

The outputs of the temperature sensors 19 are supplied to an analog to digital conversion circuit 21. As embodied herein, the output of each temperature sensor 19 can be individually converted.

The device further comprises means for selectively supplying power to the coil 15 to dissipate heat in the simulation conductor 11 equal to the heat dissipated in the overhead conductor 13. As embodied herein, the power supply means comprises processing means responsive to the temperature of the simulation conductor 11 as outputted by the analog to digital conversion circuit 21 to calculate the internal electrical resistance of the overhead conductor 13 and for calculating the value of the actual power dissipated in the overhead conductor.

In the preferred embodiment, the relationship between the temperature and the internal resistance of the overhead conductor 13 is assumed to be substantially linear. Means are provided for supplying an externally generated measurement value corresponding to the actual level of the current in the overhead conductor.

As embodied herein, the processing means comprises a microcomputer 23, incorporating a microprocessor such as the Zilog 780. The measurement value of the current flowing through the overhead conductor 13 can be generated by a pickup 25 which inductively, capacitively, or by other means senses the current flowing through the overhead conductor 13 and provides the measurement value as an input to the microcomputer 23. The pickup 25 does not comprise an element of the instant invention in that the invention merely requires an input corresponding to the actual level of current in the overhead conductor 13.

As an element of the power supply means, a simulation conductor power supply means is controlled by the microcomputer 23 to supply a selected power level as an input to the coil 15 within the simulation conductor 11. As embodied herein, the simulation conductor power supply means comprises a power controller 27, such as a zero crossing firing power unit as produced by Love Controls, having an input control signal received from the microcomputer 23 and for generating a corresponding output power signal.

The device further includes means for determining the power being supplied to the simulation conductor 11. As embodied herein, the determining means comprises a power sensor 29 coupled to the conductor 31 connecting the power controller 27 and the heating coil 15. The preferred embodiment for the power sensor uses an x-y multiplier on current and voltage. The output of the power sensor 29 is supplied as an input to the microcomputer 23.

The overhead conductor monitoring device further includes means for indicating that the temperature of the simulation conductor exceeds a predetermined temperature. As embodied, the indicating means comprises an output signal ALARM which is generated by the microcomputer 23 if the output of the analog to digital conversion circuit 21 exceeds a predetermined level. The reference temperature signal is preferably set at a level sufficiently below the temperature at which a hazardous condition would exist to provide a time period sufficient to prevent overloading of the electrical conductor. A second output signal, TEMPS, of the microprocessor is provided to transmit a signal corresponding to the actual temperature of the overhead conductor 13.

As a further feature of the present invention, an overhead conductor current selector 31 is provided to supply either the output of the sensor 25 or the value of a theoretical current, ITEST, to the microcomputer 23. This enables the effects of a hypothetical change in overhead conductor current or conductor temperature to be determined.

Figure 2:
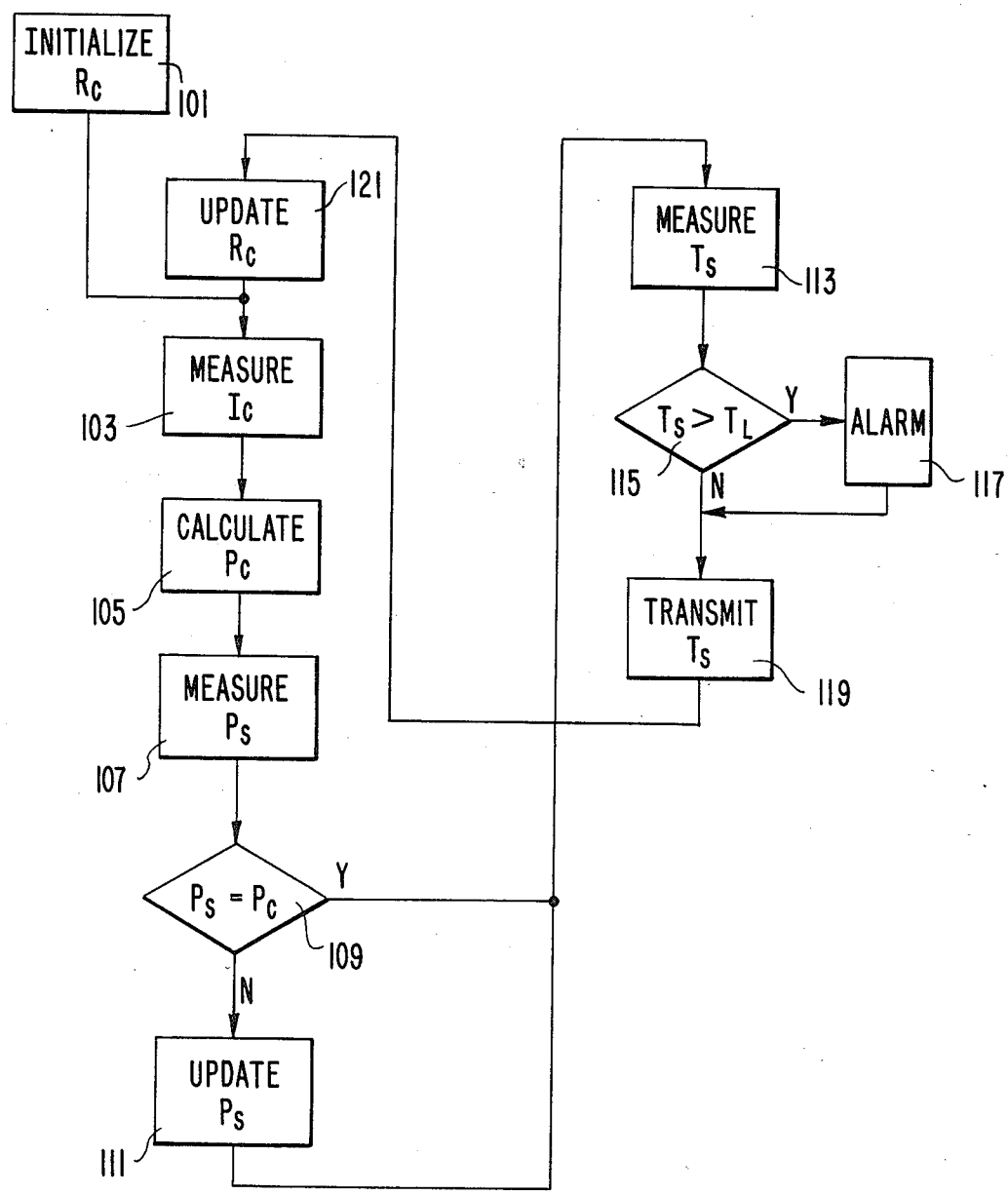
FIG. 2 is a flowchart illustrating the steps of the method of the present invention.

FIG. 2 is a flow chart illustrating the steps of the method of the present invention for preventing clearance violation by, and thermal damage to, an overhead conductor having current flowing therethrough. In step 101, an original value $R_C$ of the resistance of the overhead conductor is established. In step 103, a measurement value of the current, $I_C$, flowing through the overhead conductor 13 is supplied by an external pickup 25. Next, in step 105, the microcomputer 23 computes the power dissipated in the overhead conductor 13 according to the formula:

$$P_C = R_C I_C^2.$$

In step 107, the power sensor 27 supplies a signal $P_S$ corresponding to the actual power being supplied to the coil 15 of the simulation conductor 11. Next, the microcomputer 23 in step 109 compares the power of the overhead conductor $P_C$ to the power of the simulation conductor $P_S$. If the values are equal, processing continues with step 113. If the values are unequal, processing continues with the step 111.

In the step 111, the power controller 27 is controlled by the microcomputer 23 to change the power level supplied to the coil 15 of the simulation conductor 11 to eliminate any difference between the calculated power of the overhead conductor, $P_C$, and the power being supplied to simulation conductor, $P_S$.

In step 113, the temperature of the simulation conductor $T_S$ is measured by the temperature sensors 19 and the analog to digital conversion circuit 21 supplies a corresponding input to the microcomputer 23. The microcomputer 23, in step 115, compares the actual temperature, $T_S$, associated with the simulation conductor 11, to a selected alarm limit temperature, $T_L$. If $T_S$ is greater than $T_L$, the microcomputer 23 generates the signal, ALARM, in step 117. Next, the actual temperature, $T_S$, of the simulation conductor 11 is transmitted in step 119 and processing proceeds to step 121 for updating the value of the resistance, $R_C$, of the overhead conductor 113. As stated above, it is assumed that there is an inverse linear relationship between the temperature, $T_S$, of the simulation conductor 11 and the resistance, $R_C$, of the overhead conductor 13.

The sequence of steps 103–121 is repeated to provide continual monitoring of the overhead conductor 13.

Figure 3:
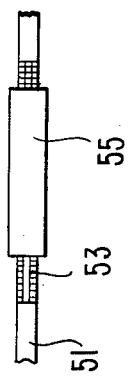
FIG. 3 illustrates a portion of a simulation conductor used in the monitoring device of the present invention.

FIG. 3 illustrates an embodiment of simulation conductor 11. As embodied herein, the simulation conductor comprises an inner set of windings 51 and an outer most winding 55. In order to form the simulation conductor 11, the outer most winding 55 is removed and a thin layer 53 of insulated resistive wire is wrapped around the inner winding 51. The outer winding 55 is then replaced over the resistive wire layer 53.

It will be apparent, to those skilled in the art, that modifications and variations can be made in the preferred embodiment in the method disclosed herein without departing from the scope and the spirit of the invention. For instance, it is possible to substitute analog devices, such as operational amplifiers and similar standard analog devices, for the microprocessor 23 in order to generate the necessary control signals. It is intended that the present invention include such modifications and variations which come within the scope of the appended claims and their equivalents.

What is claimed is:

1. A device for monitoring an overhead high voltage power line conductor having current flowing therethrough, the device comprising:
    a simulation conductor positioned in the same ambient conditions as the overhead conductor to be monitored;
    means for heating said simulation conductor;
    means responsive to a signal representative of the actual value of the current flowing through the overhead conductor, and representative of the temperature of the simulation conductor, for calculating the electrical resistivity of said overhead conductor and for selectively supplying power to said heating means to generate heat in said simulation conductor equal to the heat dissipated in the overhead conductor;
    means for sensing the actual temperature of said simulation conductor; and
    means for indicating if said temperature of said simulation conductor exceeds a predetermined temperature.

2. A device according to claim 1 wherein said power supplying means comprises:
    means for determining the power being supplied to said simulation conductor; and
    means responsive to said calculated resistance and said current of said overhead conductor for calculating the value of the actual power of the overhead conductor and for adjusting the actual power being supplied to said simulation conductor to eliminate any difference between the value of the actual power of the overhead conductor and the value of the actual power being supplied to said simulation conductor.

3. A device according to claim 2 wherein said actual temperature sensing means comprises one or more temperature sensors attached to said simulation conductor for generating respective output signals; and
    an analog-to-digital converter for generating actual temperature output signals corresponding to said output signals of said temperature sensors.

4. A device for monitoring an overhead conductor having current flowing therethrough, the device comprising:
    a simulation conductor positioned in the same ambient conditions as the overhead conductor to be monitored;
    means for heating said simulation conductor;
    means for selectively supplying power to said heating means to generate heat in said simulation conductor equal to the heat dissipated in the overhead conductor, said power supplying means including means responsive to the temperature of said simulation conductor for calculating the internal electrical resistance of said overhead conductor, and means for determining the power being supplied to said simulation conductor, and means responsive to said calculated resistance and said current in said overhead conductor for calculating the value of the actual power dissipated in said overhead conductor and for adjusting the actual power being supplied to said simulation conductor to eliminate any difference between the value of the actual power dissipated in the overhead conductor and the value of the actual power being supplied to said simulation conductor;

means for sensing the actual temperature of said simulation conductor;

means for indicating if said temperature of said simulation conductor exceeds a predetermined temperature; and an overhead conductor current selector for receiving an externally generated signal corresponding to a measured value of the current flowing through the overhead conductor and a theoretical value for the current flowing through said overhead conductor and for selectively supplying the measurement value or the theoretical value to said calculating means whereby the effect of a theoretical value for the current flowing through the overhead conductor can be determined.

5. A device according to claim 3 wherein said heating means comprises a heating coil.

6. A device according to claim 5 wherein the length of said simulation conductor is at least 10 times larger than the diameter of said simulation conductor.

7. A device according to claim 6 further including an insulation terminal at each end of said simulation conductor for thermally insulating said conductor ends.

8. A device according to claim 7 wherein said simulation conductor comprises an inner conductive winding, a layer of insulated resistive wire covering at least a portion of said inner conductive winding and coupled to said power supplying means, and an outer conductive winding covering said insulative resistive wire portions and said inner conductive winding.

9. A method for preventing thermal damage to an overhead conductor having current flowing therethrough comprising the steps of:

providing a simulation conductor in the same ambient conditions as the overhead conductor;

providing means for heating said simulation conductor;

selectively supplying power to said heating means such that said simulation conductor generates the same amount of heat per linear unit as the amount of heat being dissipated by the overhead conductor per linear unit;

sensing the actual temperature of said simulation conductor; and generating an alarm if the actual temperature of said simulation conductor exceeds a predetermined temperature.

10. A method according to claim 9 further including the steps of:

measuring the actual power supplied to said heating means;

receiving an externally generated measurement value corresponding to the current flowing through said overhead conductor;

computing the actual resistance of said overhead conductor at a temperature equal to said actual temperature of said simulation conductor;

determining in response to said computed actual resistance and the measurement value of the current flowing through the overhead conductor the power being dissipated by the overhead conductor;

computing a change in the power to be supplied to said heating means such that the simulation conductor will dissipate the same amount of power per linear unit as the power being dissipated per linear unit of the overhead conductor; and controlling the power supply means to effect said computed change in power to be supplied to the simulation conductor.

11. A device according to claim 1, wherein said simulation conductor is substantially identical in circumferential dimensions, thermal capacity, color and texture with said overhead conductor, whereby the heat dissipation characteristics in said ambient conditions will be substantially identical to the heat dissipation characteristics of said overhead conductor in said ambient conditions.

12. A device according to claim 2, wherein:

said calculating and adjusting means includes a power controller and a microprocessor, said power controller responsive to signals from said microprocessor for controlling power supplied through a conductor to said heating means; and said power determining means includes a power sensor coupled to said conductor to said heating means;

said power sensor producing a feedback signal to said microprocessor whereby said microprocessor can compare the calculated dissipation in said overhead conductor with the actual power supplied to said simulation conductor.

* * * * *